United States Patent [19]

Fukushima

[11] Patent Number: 4,922,319
[45] Date of Patent: May 1, 1990

[54] SEMICONDUCTOR PROGRAMMABLE MEMORY DEVICE

[75] Inventor: Toshitaka Fukushima, Yokohama, Japan

[73] Assignee: Fujitsu Limited, Kawasaki, Japan

[21] Appl. No.: 374,589

[22] Filed: Jul. 5, 1989

Related U.S. Application Data

[63] Continuation of Ser. No. 905,122, Sep. 9, 1986, abandoned.

[30] Foreign Application Priority Data

Sep. 9, 1985 [JP] Japan ............................ 60-198760

[51] Int. Cl.$^5$ .................. H01L 27/02; H01L 29/78; H01L 27/12
[52] U.S. Cl. .......................... 357/51; 357/4; 357/23.6; 357/41; 357/49
[58] Field of Search .............. 357/51, 23.6, 4, 41, 357/49

[56] References Cited

U.S. PATENT DOCUMENTS

| | | | |
|---|---|---|---|
| 3,717,852 | 2/1973 | Abbas et al. | 357/51 |
| 4,322,822 | 3/1982 | McPherson | 357/23.11 |
| 4,409,608 | 10/1983 | Yoder | 357/51 |
| 4,419,812 | 12/1983 | Topich | 357/51 |
| 4,455,495 | 6/1984 | Masuhara et al. | 357/51 |
| 4,488,262 | 12/1984 | Basire et al. | 365/104 |
| 4,575,925 | 3/1986 | Kanbara et al. | 357/49 |
| 4,649,406 | 3/1987 | Takemae et al. | 357/23.6 |
| 4,665,295 | 5/1987 | McDavid | 357/91 |
| 4,701,780 | 10/1987 | Hankins et al. | 357/51 |

FOREIGN PATENT DOCUMENTS

52-40540 10/1970 Japan.
53-132281 11/1978 Japan.

OTHER PUBLICATIONS

Japanese Journal of Applied Physics, vol. 21, No. 5, May 5, 1982, "Surface Silicon Crystallinity and Anomalous Composition Profiles of Buried $SiO_2$ and $Si_3N_4$ Layers Fabricated by Oxygen and Nitrogen Implantation in Silicon", by S. Maeyama et al., pp. 744–751.

Electronic Design, vol. 32, No. 5, Mar. 1983, "Single-Poly CMOS Builds Reliable Stable Capacitors", C. Panasuk, p. 50.

Journal of the Electrochemical Society, vol. 132, No. 1, "Dielectrically Isolated Thick Si Films by Lateral Epitaxy from the Melt", G. K. Celler, pp. 211–219.

"An Advanced SVG Technology for 64K Junction Shorting PROM's", by T. Fukushima et al., IEEE Trans. ED-30, No. 12, Dec. 1983.

"Surface Silicon Crystallinity and Anomalous Composition Profiles of Buried $SiO_2$ and $Si_3N_4$ Layers Fabricated by Oxygen and Nitrogen Implantation in Silicon", by S. Maeyama et al, Jpn. Jour. Apl. Phys., vol. 21, No. 5, May 1982, pp. 744–751.

"High Speed C-MOS IC Using Buried $SiO_2$ Layer Formed by Ion Implantation", by K. Izumi et al., Jap. Jour. Appl. Phys, vol. 19, Suppl. 19-1, pp. 151–154, 1980.

Primary Examiner—Andrew J. James
Assistant Examiner—Ngan Van Ngo
Attorney, Agent, or Firm—Staas & Halsey

[57] ABSTRACT

A field programmable device such as a PROM in which a memory cell is formed from a series connection of a capacitor and a diode or FET. Programming is performed by forming a short circuit in an insulation film of the capacitor due to electrical breakdown of the capacitor. The capacitor is formed of first and second semiconductor layers and an insulation film between the two layers. The instability of short circuits due to further oxidation of the insulation film is avoided by the above described structure. The memory stored in the device is stabilized, and the reliability of the device is increased. The insulation film of the capacitor is oxidized or nitrided by ion implantation of oxygen or nitrogen into the semiconductor substrate, or polycrystalline material.

19 Claims, 6 Drawing Sheets

SEMICONDUCTOR PROGRAMMABLE MEMORY DEVICE

This is a continuation of co-pending application Ser. No. 06/905,122 filed on Sept. 9, 1986 now abandoned.

BACKGROUND OF THE INVENTION

The present invention is related to a semiconductor programmable device, and more specifically to a field programmable ROM (read only memory) or logic device.

There are several kinds of memory cells used for programmable read only memory (PROM) devices, such as fuse type, diode type and so on. For example, Japanese Patent 52-40540 (1977) by T. Wada et al. discloses a capacitor and diode type memory cell, which basically discriminates between a written or unwritten state by determining whether a shorted or isolated state of a thin dielectric film exists.

Figure 1A:
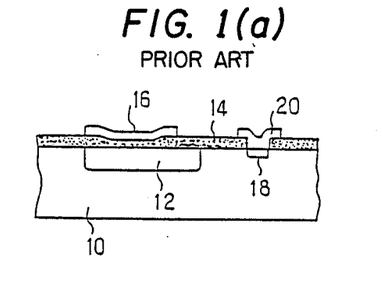
FIG. 1(a) is a schematic cross sectional view of the memory cell.
Figure 1B:
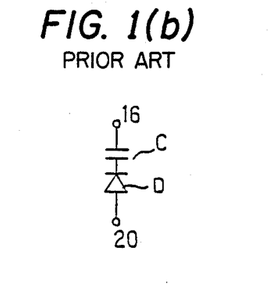
FIG. 1(b) is an equivalent circuit diagram of FIG. 8(a).

FIG. 1(a) shows a cross sectional structure of the capacitor and diode type memory cell. In the figure, 10 is a semiconductor substrate, 12 is a diffusion region, 14 is a dielectric layer, 16 is an electrode formed on it, 18 is contact region for the substrate and 20 is an electrode which contacts to region 18. The electrode 16, the dielectric layer 14 and the diffusion region 12 form a capacitor, and a diode is formed by the diffusion region 12 and the substrate 10. The equivalent circuit of such memory cell, therefore, is as shown in FIG. 1(b).

If a positive high voltage is applied to the electrode 20, and a negative high voltage is applied to the electrode 16, the dielectric layer beneath the electrode 16 is electrically broken down, and the memory cell is in a written state. So long as such voltage is not applied, the memory cell keeps the state of FIG. 1(b), corresponding to an unwritten state. The written and unwritten states correspond to data "1" and "0", and hence the memory cells functions as a programmable memory cell.

Figure 2A:
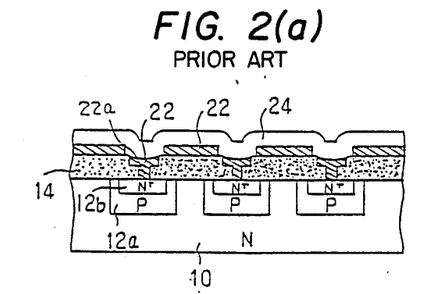
FIG. 2(a) is a schematic cross sectional view of the memory cell.
Figure 2B:
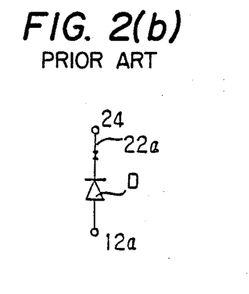
FIG. 2(b) is an equivalent circuit diagram of FIG. 2(a).

FIG. 2 is an example of a fuse and diode type memory cell disclosed in Japanese Patent 53-26462 (Priority in U.S. 1971, Ser. No. 181503) by S. A. Appas et al. In FIG. 2(a), which shows a cross sectional structure of a memory cell, 10 is an n-type semiconductor substrate, 12a and 12b are a p-type and n+-type diffusion layers respectively, 14 is an insulation layer, and 22 and 24 are conductor layers. The thickness of the insulation layer 14 over the diffusion layer 12b is controlled to as to be thin. If a high voltage is applied a current flows in a diode formed by the diffusion layers 12a and 12b, the metal of the conductor layer 22 diffuses through a thin portion of the insulator layer 14, and forms a conductive filament 22a. An equivalent circuit of the memory cell of FIG. 2(a) is shown in FIG. 2(b). The conductive filament 22a becomes a fuse element, the conductor layer 24 becomes a word line, and the diffusion layer 12a becomes the bit line of the memory cell. The programming (writing) in the memory cell is done by applying a high voltage between the word line and bit line so that a high current flows through the conductive filament to burn it out.

Figure 3A:
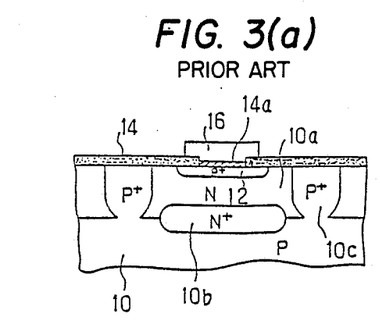
FIG. 3(a) is a schematic cross sectional view of the memory cell.
Figure 3B:
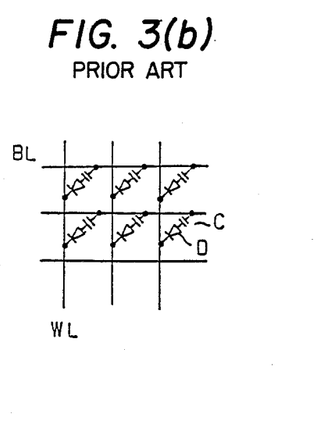
FIG. 3(b) is an equivalent circuit diagram of FIG. 3(a).

FIG. 3 is a capacitor and diode type memory matrix disclosed in Japanese laid open Patent 53-132281 (1978) by K. Okada. FIG. 3(a) is a cross sectional view. In the figure, 10 is a p-type semiconductor substrate, 10a is an n-type epitaxial layer, 10b is an n+-type buried layer, 10c is a p+-type isolation layer, 12 is a p+-type diffusion layer, 14a is an isolation layer and 16 is an electrode. In this configuration, the electrode 16, the isolation film 14a and the p+-type diffusion layer 12 form a capacitor, and the diffusion layer 12 and the n-type epitaxial layer 10a form a diode. The capacitor and the diode compose a memory cell similar to that of FIG. 1. FIG. 3(b) is a memory matrix formed of such memory cells. The writing (programming) of the memory is done by applying a voltage between a bit line and a word line in a direction so that a current flows in the diode and burns out the insulation film 14a of the capacitor.

Figure 4:
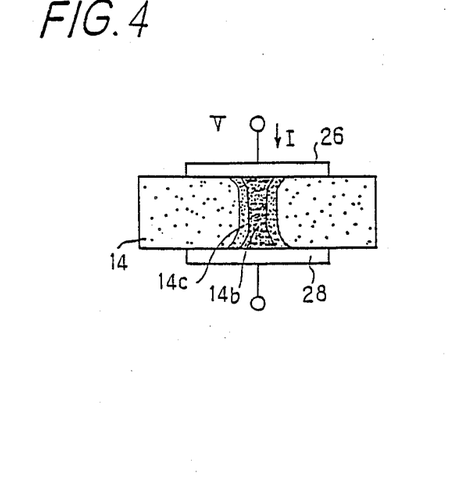
FIG. 4 is an enlarged cross section of a portion of electrically broken down insulation layer.

As has been described above, the capacitor and diode type PROM is programmed by short circuiting the insulation film of the capacitor, and a short circuit corresponds to "1" data. The reliability of the memory, therefore, depends on the stability of the broken down insulation films. FIG. 4 is an enlarged cross sectional view of an electrically broken down part of the insulation film. In the figure, 14 is the insulation layer (usually it is a silicon dioxide layer), and 26 and 28 are the electrodes. When a voltage V is applied between the electrodes, current I does not flow unless the voltage exceeds the breakdown voltage, and the resistance between the electrodes is substantially infinity.

But when a dielectric breakdown occurs, a large current I flows. FIG. 4 shows a state after a breakdown has occurred. The insulation layer 14 is bridged by a diffused region 14b of the electrode material which is surrounded by an oxidized region 14c, and the electrodes 26 and 28 are short circuited to each other. The oxidized region 14c is formed by an oxidation of the electrode metal by oxygen supplied from the insulation layer (usually it is an oxide layer). In such device, when the ambient temperature is increased, the oxidized region grows further and it eats away little by little the diffused region 14b of the electrode material. The resistance between the electrodes 26 and 28 increases gradually, and at last the electrodes are disconnected from each other. This is equivalent to the unwritten state.

Figure 5:
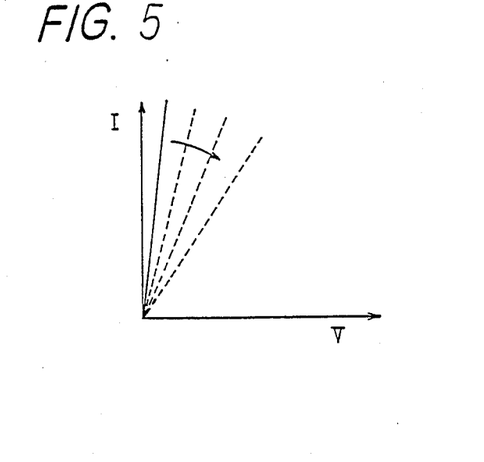
FIG. 5 is a graph of the variation in V-I characteristics of a memory cell caused by oxidation of the short circuit in the insulation layer of a memory cell.

FIG. 5 shows the variation of V-I characteristics of a memory cell. When the memory cell is programmed, or written, the resistance between the electrodes are small, and so the V-I curve of the memory cell is a straight line as shown the solid line. But, as time passes, the slope of the V-I curve shifts in the direction of the arrow and gradually becomes small as shown by the broken lines. This means an increase of the resistance of the memory cell or a decrease of the read out current and operation speed of the memory cell.

This defect may be avoided by selecting the material of the electrode which is not oxidized for the oxide insulation layer, or not nitrided for a nitride insulation layer. But in the present-state-of-the-art the material applicable to the electrode is limited to a small number of materials such as tungsten or molybdenum. The material is limited by the fabrication process of the semiconductor devices, such that it must withstand a temperature applied during the fabrication, it must have a good affinity to the insulation layer or to a wire bonding, and its patterning must be easy and so on.

Considering the affinity to the oxide insulation layer, for example, the electrode material must have a low free energy against oxidation. This means the material diffused into the insulation layer is oxidized, and the resistance of the diffused region is apt to vary its value, and hence, the reliability of the memory is not very good.

SUMMARY OF THE INVENTION

The object of the present invention, therefore, is to improve the above defects and provide a semiconductor programmable device, such as programmable ROM or programmable logic device having a high reliability and being easily fabricated.

Another object of the present invention is to provide a programmable device having a wide freedom in its design and fabrication process.

The present invention avoids the problem caused by the oxidation of the electrode material by replacing the electrode material with a semiconductor material, and hence replacing the fundamental configuration of a metal insulator semiconductor structure to a semiconductor insulator semiconductor structure. The insulation layer is fabricated by implanting oxygen or nitrogen into the semiconductor layer. For example, a silicon oxide layer is formed in a silicon layer by oxygen ion implantation.

By doing so, both sides of the insulation layer are filled with semiconductor, and the short circuit bridging the insulation layer to "write" the memory is formed from a diffused layer of semicondutor material into the oxide layer. Since the free energy of the semiconductor material against the oxide is higher than that of metal, the problem of oxidation of the short circuit, and hence, the increase of the resistance of the short circuit, is avoided.

Such technology is applicable also to various types of field programmable logic devices.

The invention proposes various structures of a semiconductor-oxide-semiconductor memory cell, which can be fabricated by various processes. Thus, the present invention extends the freedom of design and fabrication of a programmable memory device. These and other advantages of the invention will be apparent from the following description of preferred embodiments taken in connection with the accompanying drawings.

BRIEF DESCRIPTION OF THE DRAWINGS

FIG. 1 is a fundamental configuration of a prior art capacitor and diode type memory cell of a programmable read only memory device, (PROM) wherein:

FIG. 2 is a fundamental configuration of a prior art fuse and diode type memory cell of a PROM, wherein:

FIG. 3 is a general configuration of a prior art PROM device, wherein:

FIGS. 6(a)–6(f) are cross sectional diagrams of memory cells according to a first embodiment of the present invention illustrating steps during a fabrication process.

FIG. 7(a)–7(g) are cross sectional diagrams of memory cells according to a second embodiment of the present invention illustrating steps during a fabrication process.

FIG. 8(a)–8(k) are application of the present invention to fabricate various types of lateral memory cell.

FIG. 9 is an example of a capacitor and FET (field effect transistor) type memory cell, wherein:

Throughout the drawings, similar or like reference numerals designate the same or similar parts.

DESCRIPTION OF THE PREFERRED EMBODIMENTS

The structure and process for fabricating the memory device of the present invention will be described with respect to the following embodiments.

Figure 6:
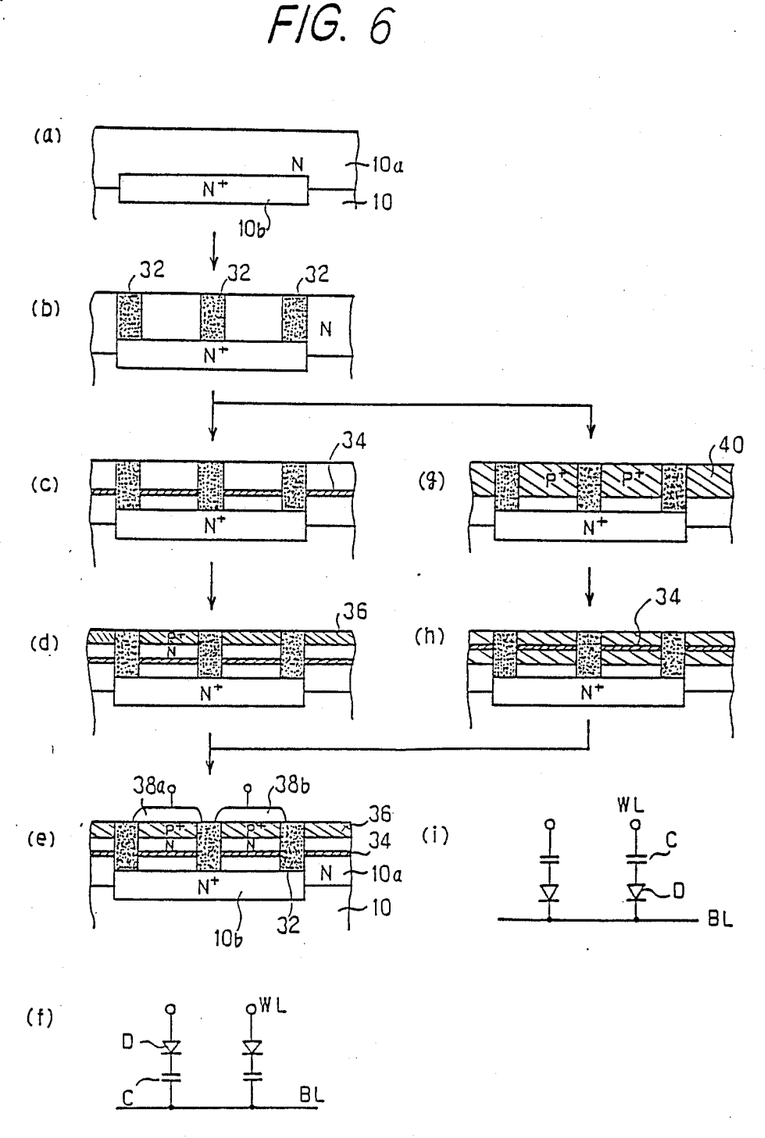

FIG. 6 is a first embodiment of the present invention. Cross sections of a memory device during fabrication are illustrated. FIG. 6(a) shows a structure of the semiconductor substrate. In FIG. 6, 10 is a p-type semiconductor substrate having a resistivity of 0.5 Ohms doped with, for example, boron, 10a is a phosphorus doped n-type epitaxial layer grown over the substrate and having a resistivity of 0.5 Ohms and a thickness of approximately 3 $\mu$m, and 10b is an n$^+$-type buried layer doped with, for example, antimony.

As shown in FIG. 6(b), isolation regions 32 approximately 2 $\mu$m wide are formed in the epitaxial layer 10a. The spacing between the isolation regions 32 is approximately 3 $\mu$m. Formation of the isolation regions 32 is done, for example, by ion implantation of oxygen with an energy of 150 keV and dose of $10^8$ cm$^{-2}$. The formation of the isolation regions 32 is not limited to ion implantation, but they may be fabricated by various other techniques, for example, oxide surrounded transistor (OST) technology or shallow V-groove (SVG) technology. The SVG technology makes grooves in the epitaxial layer and fills the grooves with silicon dioxide. The method for fabricating such separation region is not explicitly related to the present invention, so further description if omitted. Detail of such technology is disclosed for example in "An Advanced SVG Technology for 64K Junction Shorting PROM's" by T. Fukushima et al., IEEE Trans. ED-30, No. 12, December 1983.

Next, as shown in FIG. 6(c), a thin layer 34 of silicon dioxide having a thickness from a few tens to hundreds of Å is formed in the epitaxial layer 10a at a depth of approximately 1.3–1.4 $\mu$m from its surface, by implanting oxygen at, for example, an energy of 70 keV, and a dose of $10^8$ cm$^{-2}$. Further details of fabrication of an oxide layer in a silicon substrate are disclosed in for example, "High Speed C-MOS IC Using Buried SiO$_2$ Layer Formed by Ion Implantation", by K. Izumi et al. Jap. Jour. Appl. Phys., vol. 19, Supp. 19-1, PP. 151–154, 1980, and in "Surface Silicon Crystallinity and Anomalous Composition Profiles of Buried SiO$_2$ and Si$_3$N$_4$ Layers Fabricated by Oxygen and Nitrogen Implantation in Silicon", by S. Maeyama et al, Jpn. Jour. Appl. Phys., vol. 21, No. 5, May, 1982 PP. 744–751.

Succeedingly, as shown in FIG. 6(d), the surface of the epitaxial layer 10a is doped with boron at a dose $10^4$ to a depth of 0.7 μm and forms a p+-type layer 36 of 0.7 μm thick. The p+-type layer 36 may be fabricated by any process such as diffusion or ion implantation, etc. After the doping, the substrate is annealed at a proper temperature. This is a common process in the art, so further description is omitted.

Electrodes 38a and 38b are formed as shown in FIG. 6(e), and the memory cells as shown by an equivalent circuit of FIG. 6(f) are completed. The diodes D are formed by the p+-type layer 36 and the n-type epitaxial layer 10a, and the capacitor C is formed of the insulation layer 34 sandwiched by the epitaxial layer 10a. The material for the electrode may be any kind such as aluminum, various silicides or polysilicon. Surface passivation may be done by conventional methods, so further description of such processes are omitted. It will be obvious for one skilled in the art that in FIGS. 6(e) and (f), the diodes D can be replaced by Shottky diodes which are fabricated by the epitaxial layer 10a and the metal electrodes 38a and 38b.

A modification of above process may be possibly, for example, succeeding step (b), as shown in FIG. 6(g), a p+-type layer 40 of 1.3–1.4 μm is formed by doping with boron at a dose of $10^4$ cm$^{-2}$, and, then, as shown in FIG. 6(h), an insulation layer 34 is formed in the doped layer 40 in a manner similar to step (c). The electrode is then formed in a manner similar to that of the step (e), thereby obtaining memory cells as shown by the equivalent circuit of FIG. 6(i). In this embodiment, the position of the capacitor and the diode is the reverse of that in FIG. 6(f).

The programming of the memory cell is done by applying a voltage between the word line WL and the bit line BL in a direction such that a current flows in the diode D. The short circuit of the capacitor is formed by a diffusion of highly doped semiconductor maerial (i.e., silicon in the above embodiment) into the insulation layer 34. The free energy necessary to form a silicon oxide is high, so the problem of further oxidation of the short circuit is avoided. Thus, the operation of the memory cell is stabilized. Silicon may be also oxidized at a high temperature near its melting point. The semiconductor device is never used at such high temperature, so, a high reliability of the memory cell is attained. Moreover, the affinity of the silicon to the oxide layer is good, so contact problems are also avoided.

Figure 7:
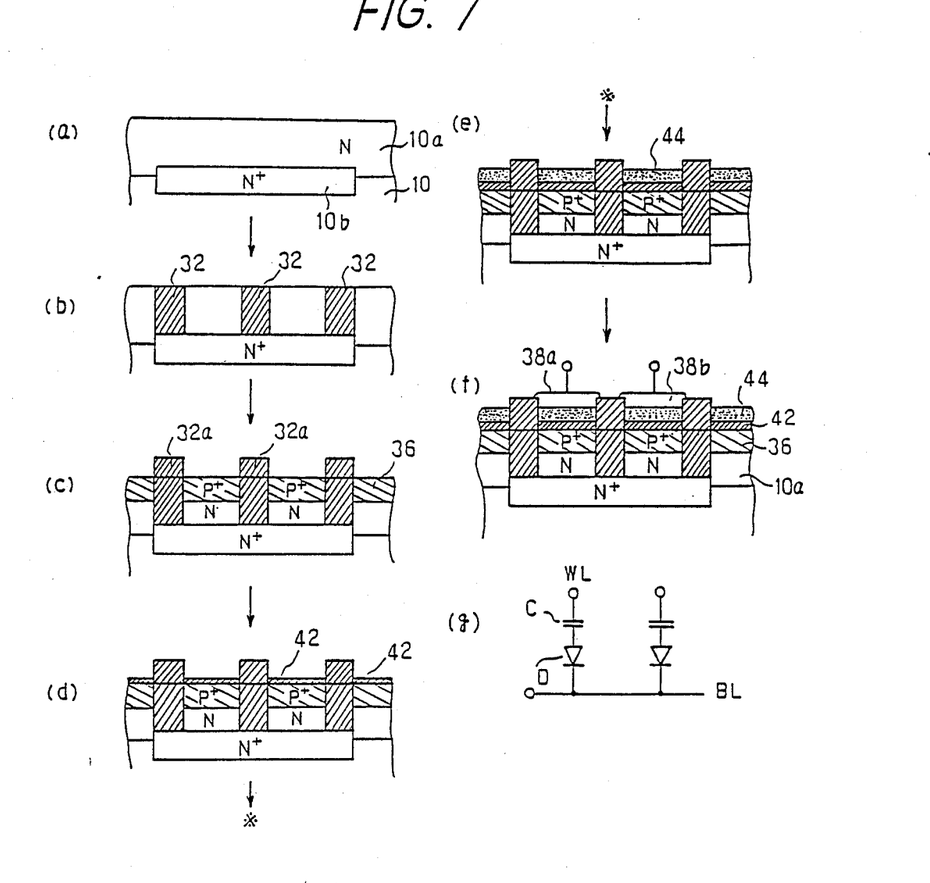

FIG. 7 illustrates the steps of a fabrication process according to a second embodiment of the present invention. The process starts with a p-type semiconductor substrate 10 similar to that of the first embodiment. The n-type epitaxial layer 10a, n+-type buried layer 10b, and the isolation regions 32 are formed. These are the same as those in FIG. 6. The steps (a) and (b) are also similar to those in FIG. 6. Thus, description of these steps is not repeated.

As shown in FIG. 7(c), a p+-type layer 36 of approximately 1.3 ∝ 1.4 μm thick is formed in a manner similar to that set forth in step (g) in FIG. 6. Isolated regions 32 are then further extended so their height is approximately 1μm by selectively growing the silicon dioxide layers 32a on the isolation region 32 as shown in FIG. 6(g). Such additional growth is done by any conventional method such as chemical vapor deposition (CVD) and photolithographic etching.

Next, as shown in FIG. 7(d), the surface of the p+-type layer 36 is covered by a film of silicon dioxide 42 having a thickness on the order of a few tens to hundreds of Å. The film 42 is formed by any conventional process, such as thermal oxidation, or CVD. After that, on the surface of the silicon dioxide layer 42 a highly doped boron p+-type polysilicon layer 44 of approximately 0.7 μm thick is formed as shown in FIG. 7(e).

Then, by forming the electrodes 38a and 38a as shown in FIG. 7(f), the memory cells as shown by an equivalent circuit of FIG. 7(g) is completed. The surface passivation and the formation and wiring of the electrodes are similar to conventional semiconductor devices. In this memory cell, the capacitor C is composed of the polysilicon layer 44, the silicon dioxide layer 42 and the p+-type epitaxial layer 36. The diode D is formed of the p+-type layer 36 and the n-type epitaxial layer 10a.

In this embodiment, after step (e) of the fabrication process, the polysilicon layer 44 may be recrystallized by laser irradiation or electron beam irradiation. By doing so, the resistance of the memory cell is further decreased, and better characteristics of the memory operation are expected. The process to recrystallize the polysilicon is disclosed, for example, in U.S. Pat. No. 4,575,925 (Mar. 18, 1986) by K. Kanbara et al.

The structure of the memory cells as described with respect to the first and second embodiments may be called vertical type, because the diode and capacitor are arranged vertically in the substrate. But it is possible to provide a lateral type memory cell in which the diode and capacitor are arranged in a lateral direction, that is, parallel to the surface to the substrate.

Figure 8:
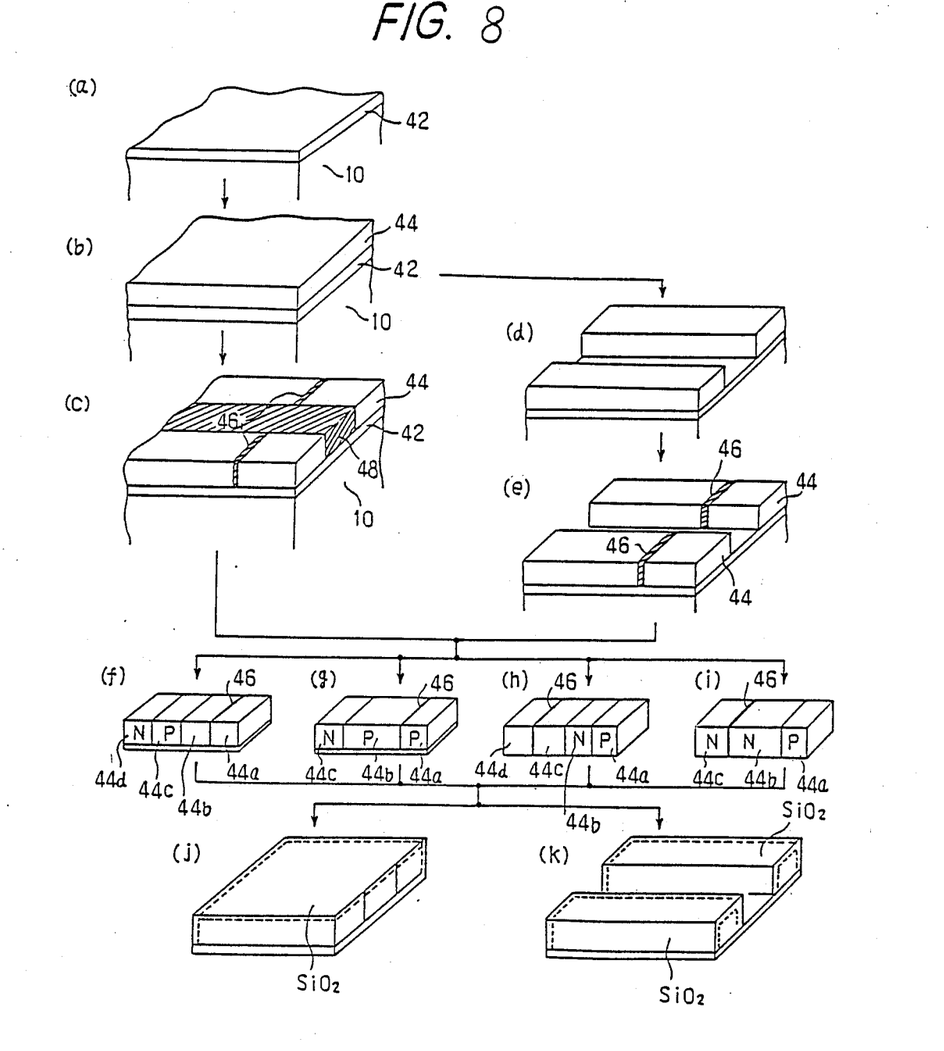

FIG. 8 illustrates the fabrication steps of a lateral type memory cell. As shown in FIG. 8(a), on an n+-type silicon epitaxial layer 10 is formed a silicon dioxide layer 42 of approximately 5,000 Å thick. The epitaxial layer 10 in FIG. 8(a) corresponds to the epitaxial layer 10a in FIG. 6(a). The silicon dioxide layer 42 may be fabricated by any conventional method, such as, for example, CVD or thermal oxidation.

Next, as shown in FIG. 8(b), a polysilicon layer 44 of approximately 1 μm thick is formed. Then the polysilicon layer 44 is isolated by silicon dioxide isolation regions 48 and 46 as shown in FIG. 8(c). The width of the isolation region 48 is approximately 2 μm, and the width of the isolation region 46 is from few tens to hundreds of Å. This process is similar to that of the process (b) in FIG. 6. The isolation region 46 becomes an isolation film of the capacitor. The isolation region 48 may be formed by oxygen ion implantation, FIOS, OST or SVG methods. As a modification, the isolation region 48 may be etched off as shown in FIG. 8(d). The isolation region 46 is then formed as shown in FIG. 8(e).

Following the isolation process, the diode and capacitor are formed by doping the polysilicon layer 44. In this step, various modifications of the configurations are possible as shown in FIGS. 8(f) through (i).

In the configuration of FIG. 8(f), the polysilicon layer 44 is divided into four sections 44a, 44b, 44c and 44d, each having a width of approximately 1 μm. The sections 44a and 44b are left undoped, and the sections 44c and 4d are doped and transferred to p and n type regions respectively. The capacitor is composed of the isolation region 46 and the polysilicon sections 44a and 4b. The diode is composed of sections 44c and 44d.

In the configuration of FIG. 8(g), the polysilicon layer 44 is divided into three sections 44a, 44b, and 44c. The width of the section 44b is approximately 2 μm, and the width of the other sections are approximately 1 μm. The sections 44a and 44b are doped with a p-type dopant and the section 44c is doped with n-type dopant.

The capacitor is composed of the isolation region 46 and the polysilicon sections 44a and 44b. The diode is composed of the sections 44b and 44c.

In the configurations of FIGS. 8(h) and (i), the position of the isolation region 46 is different from FIGS. 8(f) and (g). The position of the diode and capacitor is reversed with respect to each other, but other parts are all similar. It is possible to alter the position of the p and n type doped sections to reverse the direction of conductivity of the diode.

Doping is performed by conventional selective diffusion using photolithography, but it may be done by ion implantation. For the p and n type dopants, for example, boron and phosphorus are used, respectively. After the memory cells are formed, the surface of the device is coated with a passivation film as shown in FIGS. 8(j) and (k). Usually the passivation film is silicon dioxide, or phospho-silicate glass. The electrodes contact respective points through an opening provided in the passivation film. It is also possible to take the contact from the side of the semiconductor substrate 10. These methods are all conventional in the art, so further description is omitted.

In a fourth embodiment according to the present invention the diodes in the memory cell are used to block the reverse current flow through the unselected memory cells when the memory matrix is in read-out or program operation. During the read out operation, for example, the bit line and the word line corresponding to the memory cell to be read out are positively and negatively biased, respectively, the remaining bit lines are negatively biased and the word lines are positively biased. Therefore, without the blocking diodes, the unselected memory cells conduct currents and the read-out operation can not be performed. But if the diodes are provided, the diodes of the unselected memory cells are reversely biased, and the reverse currents are blocked. Therefore, only the selected memory cell conducts current and the read out process is performed.

Figure 9A:
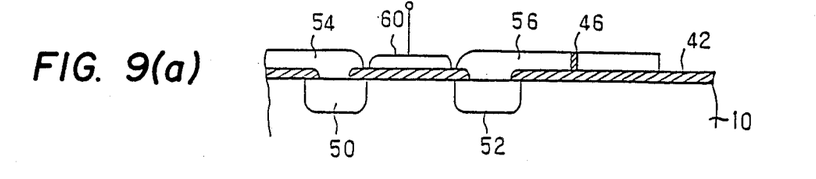
FIG. 9(a) is a schematic cross section of the memory cell.

Blocking of the reverse currents can be done not only by a diode but by other devices such as FETs (field effect transistors). FIG. 9 is a cross section of an embodiment using a MOS (metal oxide semiconductor) transistor in place of the diode. In FIG. 9(a), 50 and 52 are, respectively, the source and drain regions, 54 and 56 are the source and drain electrodes, respectively, 60 is a gate electrode. These form the MOS transistor Q. The electrodes 54 and 56 extended over a field oxide layer 42 and are properly wired.

Figure 9B:
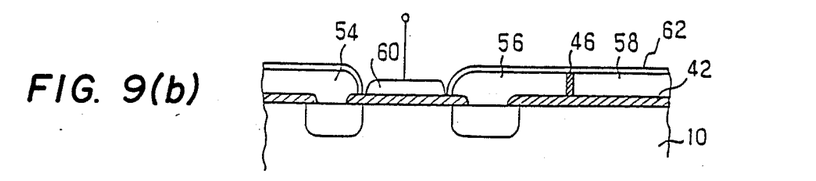
FIG. 9(b) shows the memory cell of FIG. 9(a) protected by a passivation film.
Figure 9C:
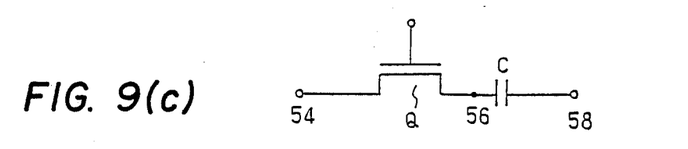
FIG. 9(c) is an equivalent circuit diagram of FIG. 9(a).

Polycrystalline silicon is often used for the gate electrode of the MOS transistor. In this embodiment, the source and drain electrodes are also formed by polysilicon. In the source electrode 56 is formed a thin insulation layer 46 of silicon dioxide as shown in FIG. 9(a). The thickness of the insulation layer 46 is from few tens to hundreds of Å, and its formation process is similar to that of the layer 46 in the third embodiment. As shown in FIG. 9(b), the surface of the device is coated with, for example, a surface passivation layer 62 of a silicon dioxide film. FIG. 9(c) is an equivalent circuit of a memory cell.

In the above description, the embodiments have been disclosed with respect to a silicon substrate and an insulation layer of silicon dioxide. It will be clear to one of skill in the art that the insulation layer may be silicon nitride, for example, in which case nitrogen implantation is applicable. Further silicon may be replaced by any kind of semiconductor material such as germanium or gallium arsenide.

As have been described above, the present invention has changed the structure of the capacitor of the PROM device from a metal-oxide-semiconductor structure to a semiconductor-oxide-semiconductor structure. Thus, the variation of the resistance of the short circuit during its operation has been avoided, and a stable memory operation has been attained.

The above disclosure of the present invention has been provided with respect to memory devices, but it will be also clear to one skilled in the art that the memory cells described above are applicable to a logic circuit to provide a field programmable logic device.

What is claimed are as follows:

1. A semiconductor programmable device having a memoy cell including a word line and a bit line, comprising:

a semiconductor substrate;

a buried layer formed in said semiconductor substrate, said buried layer having a $n^+$-type high impurity concentration;

an n-type silicon layer, formed on said buried layer, having a lower impurity concentration than that of said buried layer;

a p-type silicon layer formed on said n-type silicon layer for forming a diode;

an insulation layer, formed in said n-type silicon layer, dividing said n-type silicon layer into an upper layer and a lower layer, said insulation layer, and said upper and lower n-type silicon layers forming a capacitor;

an isolation region formed of silicon dioxide and surrounding a portion of said n-type silicon layer, said insulation layer, and said p-type silicon layer, said diode and said capacitor being connected in series between the word line and bit line of the memory cell;

the memory cell being programmable by applying a high voltage to said capacitor and forming a bypass circuit in said insulation layer by dielectric breakdown of said insulation layer, said by-pass circuit being formed of doped silicon and including materials substantially the same as those of said upper and lower layers.

2. A semiconductor programmable device having a memory cell including a word line and a bit line, comprising:

a semiconductor substrate;

a buried layer formed in said semiconductor substrate having an $n^+$-type high impurity concentration;

an n-type silicon layer, formed on said buried layer, having a lower impurity concentration than that of said buried layer;

a p-type silicon layer formed on said n-type silicon layer forming a diode;

an insulation layer formed in said p-type silicon layer dividing said p-type silicon layer into an upper layer and a lower layer, said insulation layer, said upper layer, and said lower layer forming a capacitor; and an isolation region formed of silicon dioxide and surrounding a portion of said n-type silicon layer, said insulation layer and said p-type silicon layer, said diode and said capacitor being connected in series between the word line and the bit line of the memory cell;

the memory cell being programmable by applying a high voltage to said capacitor and forming a by-pass circuit in said insulation layer by dielectric breakdown of said insulation layer, said by-pass circuit formed of doped silicon and including materials substantially the same as those of said upper and lower layers.

3. A semiconductor programmable device having a memory cell comprising:
a semiconductor substrate;
an insulation layer covering a surface of a semiconductor substrate;
a silicon layer formed on said insulation layer;
an isolation film, formed in said silicon layer, laterally dividing said silicon layer into first and second portions, said first and second portions in said isolation film forming a lateral capacitor; and
a lateral diode formed in one of said first and second portions, said memory cell being programmable by applying a high voltage to said capacitor and forming a by-pass circuit in said isolation film of said capacitor by dielectric breakdown of said isolation film, said by-pass circuit being formed of doped silicon and including materials substantially the same as those of said first and second silicon layers.

4. A semiconductor programmable device having a memory cell comprising:
a semiconductor substrate;
an insulation layer covering a surface of said semiconductor substrate and having a contact hole formed therein;
a silicon layer formed on said insulation layer;
an isolation film formed in said silicon layer for laterally dividing said silicon layer into first and second silicon layers, said first and second silicon layers and said isolation film forming a lateral capacitor; and
a field effect transistor formed in series with said lateral capacitor, having source and drain regions formed in said semiconductor substrate, a drain electrode being connected to said second silicon layer through said contact hole formed in said insulation layer, said memory cell being programmable by applying a high voltage to said capacitor and forming a by-pass circuit in said isolation film of said capacitor by dielectric breakdown of said isolation film, said by-pass circuit being formed of doped silicon and including materials substantially the same as those of said first and second silicon layers.

5. A semiconductor programmable device according to claim 1, wherein said insulation layer is an oxide film.

6. A semiconductor programmable device according to claim 2, wherein said insulation layer is an oxide film.

7. A semiconductor programmable device according to claim 3, wherein said insulation layer is an oxide film.

8. A semiconductor programmable device according to claim 1, wherein said semiconductor substrate comprises silicon and wherein said insulation layer comprises a silicon dioxide film.

9. A semiconductor programmable device according to claim 1, wherein said semiconductor substrate comprises silicon and wherein said insulation layer comprises a silicon nitride film.

10. A semiconductor programmable device according to claim 1, wherein said insulation layer comprises a silicon dioxide film.

11. A semiconductor programmable device according to claim 3, wherein said insulation layer comprises a silicon dioxide film.

12. A semiconductor programmable device according to claim 4, wherein said insulation layer comprises a silicon dioxide film.

13. A semiconductor programmable device according to claim 2, wherein said insulation layer comprises a silicon nitride film.

14. A semiconductor programmable device according to claim 3, wherein said insulation layer comprises a silicon nitride film.

15. A semiconductor programmable device according to claim 4, wherein said insulation layer comprises a silicon nitride film.

16. A semiconductor device according to claim 1, wherein said insulation layer is formed at a depth of approximately 1.3 to 1.4 $\mu$m from the surface of said n-type silicon layer.

17. A semiconductor programmable device according to claim 16, wherein said isolation regions are approximately 2 $\mu$m wide and are spaced at a distance of approximately 3 $\mu$m.

18. A semiconductor device as set forth in claim 2, wherein said insulation layer is formed to a depth of approximately 1.3 to 1.4 $\mu$m in said p-type silicon layer.

19. A semiconductor device according to claim 18, wherein said isolation regions are approximately 2 $\mu$m wide and are spaced at a distance of approximately 3 $\mu$m.

* * * * *